United States Patent
Theriault et al.

(10) Patent No.: US 6,711,961 B2
(45) Date of Patent: Mar. 30, 2004

(54) METHODS AND APPARATUS FOR RECYCLING CRYOGENIC LIQUID OR GAS FROM TEST CHAMBERS

(75) Inventors: Martin Theriault, Houston, TX (US); Philippe Blostein, Paris (FR)

(73) Assignee: Air Liquide America Corporation, Houston, TX (US)

(*) Notice: Subject to any disclaimer, the term of this patent is extended or adjusted under 35 U.S.C. 154(b) by 0 days.

(21) Appl. No.: 10/004,597

(22) Filed: Oct. 22, 2001

(65) Prior Publication Data

US 2002/0092357 A1 Jul. 18, 2002

Related U.S. Application Data

(60) Provisional application No. 60/242,947, filed on Oct. 24, 2000.

(51) Int. Cl.[7] .................. G01N 17/00; G01N 25/00; G01R 31/26
(52) U.S. Cl. .................. 73/865.6; 324/760
(58) Field of Search .............. 73/865.6, 37; 324/760; 62/115, 125, 129

(56) References Cited

U.S. PATENT DOCUMENTS

| | | | | | |
|---|---|---|---|---|---|
| 3,670,564 A | * | 6/1972 | Davis et al. | ............... | 73/117.1 |
| 3,693,423 A | * | 9/1972 | Triplett | ............... | 73/117.1 |
| 3,938,554 A | * | 2/1976 | Samuels | ............... | 137/625.61 |
| 4,550,574 A | * | 11/1985 | Hohman | ............... | 62/197 |
| 4,871,965 A | * | 10/1989 | Elbert et al. | ............... | 324/158 F |
| 5,039,228 A | * | 8/1991 | Chalmers | ............... | 374/57 |
| 5,290,101 A | * | 3/1994 | Englert et al. | ............... | 374/57 |
| 5,355,456 A | * | 10/1994 | Osofsky | ............... | 392/342 |
| 5,361,284 A | * | 11/1994 | Baum et al. | ............... | 376/245 |
| 5,390,505 A | * | 2/1995 | Smith et al. | ............... | 62/173 |
| 5,459,408 A | | 10/1995 | Chen | ............... | 324/760 |
| 5,549,794 A | * | 8/1996 | Mar | ............... | 202/169 |
| 6,023,985 A | * | 2/2000 | Fournier | ............... | 73/865.6 |
| 6,134,941 A | * | 10/2000 | Cripe et al. | ............... | 73/1.02 |
| 6,182,453 B1 | * | 2/2001 | Forsberg | ............... | 62/125 |
| 6,271,024 B1 | * | 8/2001 | Sve et al. | ............... | 435/303.1 |
| 6,606,052 B1 | * | 8/2003 | Miyahara | ............... | 342/70 |

FOREIGN PATENT DOCUMENTS

| | | | | |
|---|---|---|---|---|
| JP | 1156678 | | 6/1989 | |
| JP | 01156678 A | * | 6/1989 | ........... G01R/31/26 |

OTHER PUBLICATIONS

Goosens, Michel, "Cryogenic System", 1995, Available on the Internet at <http://atlas.web.cern.ch/Atlas/TP/NEW/HTML/tp9new/node203.html>.*

Controlled Enviroments, Inc., Liquid Nitrogen Based Environmental Test Chambers, Date–Unknown. but prior art before Oct. 24, 2000 published.

International Search Report PCT Chapter I 210.

* cited by examiner

*Primary Examiner*—Hezron Williams
*Assistant Examiner*—David Rogers
(74) *Attorney, Agent, or Firm*—Linda K. Russell; Elwood Haynes

(57) ABSTRACT

Methods and apparatus are presented which allow efficient environmental testing of components such as printed circuit boards, integrated circuits, sub-systems and other components. In one method of the invention, a component can be placed into a chamber having an internal space filled with a gaseous atmosphere. The component is indirectly cooled by smartly positioning one or more cooling coils near the component to be tested, and the cooling coils are fed with a cryogenic fluid from a source of cryogenic fluid. The warm cryogenic fluid is recycled by one of two means: a thermosiphon conduit loop, and a storage and compression facility for reusing the warm cryogenic fluid. The internal space is preferably filled with a dry gas.

21 Claims, 3 Drawing Sheets

METHODS AND APPARATUS FOR RECYCLING CRYOGENIC LIQUID OR GAS FROM TEST CHAMBERS

CROSS REFERENCE TO RELATED APPLICATIONS

This application is related to co-pending provisional application serial No. 60/242,947, filed Oct. 24, 2000, which is incorporated by reference herein.

BACKGROUND OF THE INVENTION

1. Brief Description of the Invention

Present invention involves testing of components and electronic sub-systems, such as electrical components using cryogenic fluids to rapidly change temperature of the components.

2. Related Art

The use of environmental testing (ET) techniques such as Environmental Stress Screening (ESS), Accelerated Stress Testing (AST), Highly Accelerated Life Testing (HALT) and Highly Accelerated Stress Screening (HASS) is increasing significantly in the electronics manufacturing. These types of tests are frequently performed on various products ranging from semiconductors, packaged integrated circuits (IC), assembled printed circuit boards (PCBs), fiber-optics devices, or final assembled products (two examples being airplane radar equipment and computer servers). These techniques environmentally strain the manufactured products using stresses that are substantially higher than those experienced in the product life. These tests intend to help precipitate latent defects at minimum costs and in minimum time; detect as many defects as possible at minimum cost and in minimum time; provide the closed loop to failure analysis and corrective actions for all defects found in screening; increase field reliability; and decrease the total cost of production, maintenance, and warranty. In a world where electronics is key to most day-to-day activities, reducing costs and increasing reliability is crucial. For that reason, ET techniques are gaining rapid adoption.

The types of stresses applied to the electronic device vary greatly but most frequently include thermal testing. Thermal testing comprises heating and cooling a device in rapid fashion (up to 100° C. ΔT per minute). The faster the heating or cooling, the better the test is and the faster the products tested can be analyzed and then shipped for repairs or sold on the market. Cooling is typically achieved by using a CFC-based mechanical refrigeration unit or by using cold, cryogenic vaporized liquefied gas that directly contacts the device. The gas used is generally nitrogen as it is relatively safe and it is usually the least expensive commercially inert gas. Other types of gases such as carbon dioxide could be used in certain situations.

The use of vaporized cryogenic liquefied gases is substantial in this art and adds a significant cost to the manufacturing process of the end products. Although generally cost-effective, there is increasing pressure to reduce cryogenic liquid/gas usage and optimize its use. Current systems use mainly a direct injection scheme, where recycling is impossible, or the use of indirect cooling through the use of cooling coils. Typically in both situations the warmed cryogenic gas is vented to the atmosphere.

There is thus a need in the art for better utilization of cryogenic liquefied gas in the ET art, primarily in order to reduce the costs associated with cryogenic liquefied gas usage.

SUMMARY OF THE INVENTION

In accordance with the present invention, cryogenic liquefied gas that is used in ET processes is recycled using indirect cooling schemes, in other words, using cooling coils where a cryogenic liquid flows there through. These systems allow recycling of the cryogenic fluid, wherein the term "recycling" includes downstream use of warmed cryogenic fluid after serving its purpose in the ET process.

More specifically, the present invention proposes the use of efficient and improved cooling coils, wherein cryogenic liquefied gas (preferably liquid nitrogen, argon or mixture thereof) enters the coil, where the coils are smartly positioned within an ET chamber, the cryogenic fluid cools the chamber by indirect heat exchange, thus creating a warm cryogenic fluid (at this point either completely gaseous or a mixture of liquid and gas phases). The warmed cryogenic fluid is then sent to a recycling station. The invention comprises thermal cycling (lowering and increasing temperature in cyclic fashion) as well as only cooling, or only heating, but preferred is thermal cooling. Thermal cooling may comprise cooling at a rate ranging from very slow, say 1° C. ΔT per minute, to very rapid, up to about 100° C. ΔT per minute.

As used in the present invention, "recycling" encompasses two primary methods: (a) using a thermosiphon cryogenic vessel and associated equipment, and (b) recompressing the warm cryogenic fluid and/or storing the cryogenic fluid for other plant uses. "Smartly positioning" and "smartly positioned" as used herein means that the device to be tested and the coils are positioned relative to each other inside the test chamber in a fashion where cooling coils adequately perform their function in raising or lowering the temperature of device. "Adequately perform" means that the cooling or heating occurs in a precise, controlled manner.

The methods and apparatus of the invention provide significant cost savings to the ET processes. Costs associated with using cryogenic fluids can approach zero when the gas is needed elsewhere in the plant.

A first aspect of the invention is a method of environmental testing of a component (preferably an IC, a PCB, a sub-system, and the like), the method comprising of steps of:
 (a) placing a component to be tested into a chamber, the chamber having an internal space filled with a gaseous atmosphere;
 (b) indirectly cooling the component by smartly positioning one or more cooling coils near the component to be tested;
 (c) feeding the cooling coils with a cryogenic fluid from a source of cryogenic fluid, thus cooling the components and creating a warm cryogenic fluid; and
 (d) recycling the warm cryogenic fluid to the source of cryogenic fluid in a thermosiphon fashion using a thermosiphon conduit loop.

Preferred are methods wherein the gaseous atmosphere is non-stagnant (preferably circulated) within the internal space; methods including measuring a temperature of the gaseous atmosphere in the internal space; methods including controlling flow of cryogenic fluid at least partially based on the temperature of the internal space; methods including measuring a temperature of the cryogenic fluid flowing into the coils; and methods including controlling flow of cryogenic fluid at least partially based on temperature of the cryogenic fluid flowing into the coils.

A second aspect of the invention is an apparatus for environmental testing of a component, the apparatus comprising:

(a) a test chamber having an internal space adapted to hold one or more components to be tested.

(b) at least one cooling coil smartly positioned within the test chamber;

(c) a cryogenic fluid feed conduit connecting a source of cryogenic fluid and the coils; and (d) a cryogenic fluid return conduit connecting the coils to the source of cryogenic fluid, wherein the cryogenic fluid feed conduit and the cryogenic fluid return conduit are connected in a thermosiphon loop.

Preferred are apparatus wherein the test chamber includes means for circulating the gaseous atmosphere in the internal space; apparatus including means for measuring temperature of the internal space of the test chamber; apparatus including means to control the flow of the cryogenic fluid from the cryogenic fluid source.

A third aspect of the invention is a method of environmental testing of a component, the method comprising of steps of:

(a) placing a component to be tested into a chamber, the chamber having an internal space filled with a gaseous atmosphere;

(b) indirectly cooling the component by smartly positioning one or more cooling coils near the component to be tested;

(c) feeding the cooling coils with a cryogenic fluid from a source of cryogenic fluid, thus cooling the components and creating a warm cryogenic fluid; and (d) flowing the warm cryogenic fluid to a storage device.

Preferred are method including compressing the warm cryogenic fluid to form a compressed cryogenic fluid, and routing the compressed cryogenic fluid to a high pressure storage device; methods including routing at least some of the compressed cryogenic fluid to another use point, the use point selected from the group consisting of other uses on-site, other uses off-site, and storage containers; methods including routing a portion of the warm cryogenic fluid into the internal space; methods including routing a dry gas into the internal space; and methods including vaporizing a portion of the cryogenic fluid in the cryogenic fluid storage container and routing it to other uses.

As used herein the term "dry" means a gas containing no more than about 1 percent water, more preferably no more than about 100 parts per million (ppm) water, more preferably no more than 100 parts per billion (ppb) water, most preferably no more than 1 ppb.

A fourth aspect of the invention is an apparatus for environmental testing of a component, the apparatus comprising:

(a) a test chamber having an internal space adapted to hold one or more components to be tested.

(b) at least one cooling coil smartly positioned within the test chamber;

(c) a cryogenic fluid feed conduit connecting a source of cryogenic fluid and the cooling coils; and (d) a storage device for the warm cryogenic fluid, and a conduit connecting cooling coils to the storage device.

Preferred are apparatus including compression means for compressing the warm cryogenic fluid to form a compressed cryogenic fluid; apparatus comprising a high pressure storage device which takes feed from the compression means; apparatus including a conduit which feeds the compressed cryogenic fluid to other points of use; apparatus including a conduit connecting the source of cryogenic fluid with a heat exchange unit, and a conduit connecting the heat exchange unit with the conduit for supplying alternate uses; apparatus including means for allowing a portion of the warm cryogenic fluid to enter the internal space in the test chamber; apparatus including a temperature measuring means on the test chamber for sensing a temperature of the internal space; apparatus comprising a liquid level sensor on the source of liquid cryogenic fluid; apparatus including control means for controlling the flow out of and flow into the cryogenic storage means; and apparatus including means for delivery of a dry gas to the internal space.

Further appreciation and understanding of the invention will be gained by review of the following description and claims.

DESCRIPTION OF PREFERRED EMBODIMENTS

The inventors herein reviewed various options in order to reduce the cost associated with the use of liquefied gases in ET processes. It was discovered that systems using indirect injection with cooling coils could be implemented. More specifically, the positioning of the cooling coils, as well as the design of the coils themselves, if upgraded for better efficiency, would reduce the cost of using cryogenic liquefied gases. It became apparent to the inventors herein that there were certain advantages of using systems having efficient coils and coil positioning. Among these were (a) the heat exchange rate was almost as efficient as most direct injection systems; (b) there would be no safety issues associated with injecting an inert atmosphere into a chamber where workers might have to access, and (c) that if the "warm" cryogenic fluid could be reused in some fashion, the efficiencies would be increased.

Figure 1:
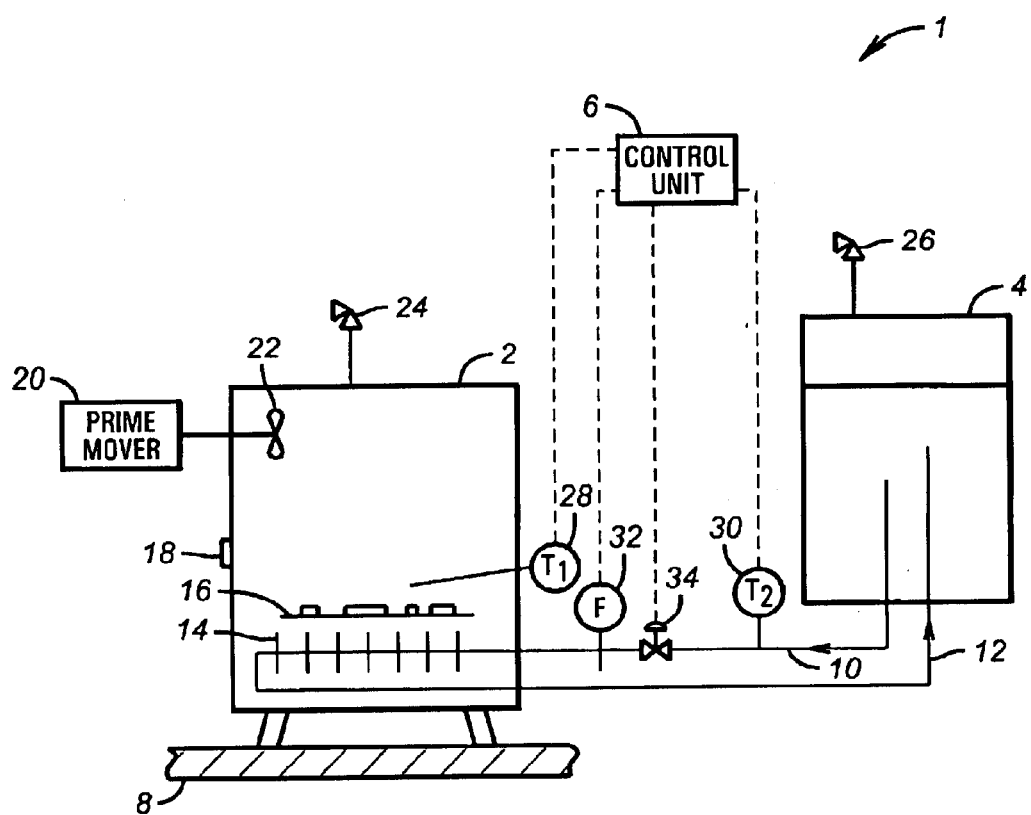
FIGS. 1, 2, and 3 are schematic flow diagrams of three preferred methods and apparatus in accordance with the present invention.

Therefore, the present invention pertains to recycling the cryogenic liquefied gas that is used in indirect cooling systems. It will be understood that the inventive methods are not limited to only cooling, but that is one preferred use of the methods and apparatus. For example, cryogen fluid that has been vaporized and contacted with a test component for cooling can be reused, either to increase the temperature of a component previously cooled, or to decrease the temperature of a component which would need to be cooled at a less cold temperature, or for inerting purpose. As another example, the methods and apparatus may be employed in thermal cycling of components between extremely low temperatures and high temperatures. To achieve the high temperatures, the flow of cryogenic fluid is preferably turned off, and remaining vapor in the chamber is heated by heating units preferably placed internal to the chamber. Preferred are internal ceramic heaters, such as typically used today. Fans positioned internally in the chamber help to circulate the vapor Turning now to the drawing FIGs., FIG. 1 illustrates a first method and apparatus embodiment of the invention, designated as 1. Apparatus 1 in this embodiment comprises an environmental testing chamber, 2, and a thermosiphon 4. In order for thermosiphon 4 and more particularly, the cryogenic fluid, to perform its function, thermosiphon device 4 is preferably positioned slightly above the level of the cooling coils 14 to provide sufficient liquid head. Conduits 10 and 12 provide this as illustrated in FIG. 1. The operation of a thermosiphon device is known in the art of liquified gas storage and requires little explanation here. Essentially a warmer fluid will have a lower density than a cooler fluid of the same composition, and therefore the cooler fluid will tend to displace a warmer fluid in a conduit system such as that depicted in FIG. 1.

FIG. 1 illustrates, for example, cooling coils 14 smartly positioned above a printed circuit board 16 in test chamber 2. Environmental test chamber 2 also includes a door or other opening means typically including a handle depicted as 18 in FIG. 1 that allows devices to be tested to be moved in and out of test chamber 2. Optionally, there may be provided a prime mover 20 and an associated fan or blower 22, to increase movement of gaseous atmosphere within test chamber 2. Furthermore, test chamber 2 is typically insulated using insulation well known in temperature cycling conditions, the insulation not illustrated in the FIGs. so as to provide clarity. Conduits 10 and 12 for example might preferably employ the use of vacuum insulated conduits, well known in the cryogenic art, especially conduit 10 to preserve the low temperature of the cryogenic fluid. Typically the environmental test chamber 2 will rest on a support 8, such as a floor of a manufacturing facility or plant.

For increased safety, environmental testing chamber 2 and thermosiphon 4 will have pressure release devices, 24 and 26, respectively. A pressure relief device may also be positioned on either one or both of conduits 10 or 12.

Although a thermosiphon will operate quite well on its own, in preferred embodiments it may be desirable to include a flow measuring device 32, and temperature measuring devices 28 and 30 as depicted in FIG. 1. These three monitors, which are by no means exclusive, preferably take readings of the flow rate of the cryogenic fluid flowing into cooling coils 14, temperature of the atmosphere within test chamber 2, and temperature of the cryogenic fluid flowing to the cooling coils 14. A control unit, such as illustrated at 6 is preferably used to control flow of cryogenic fluid using a control valve 34. Control unit 6 preferably in turn is controlled locally or remotely by a supervisory control system (not illustrated).

Figure 2:
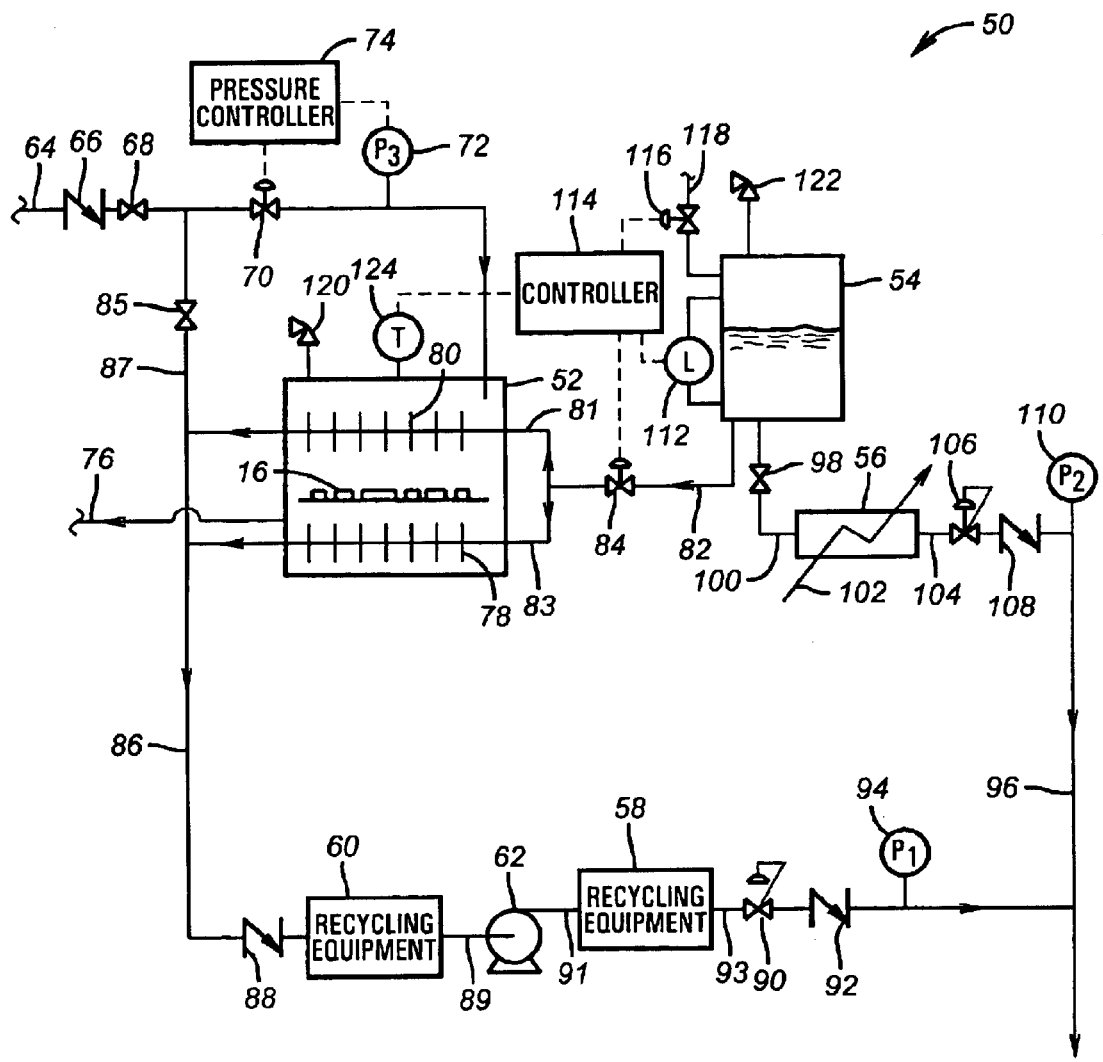

Referring now to FIG. 2, FIG. 2 illustrates a second embodiment 50 of method and apparatus of the invention. Embodiment 50 illustrated includes an environmental testing chamber 52 in which might be placed one or more of manufactured components indicated at 16, such as printed circuit board. Embodiment 50 also includes a cryogenic fluid storage vessel 54, a heat exchange or vaporization unit 56, a high-pressure storage unit 58, and a lower pressure storage unit 60. One or more of each of units 54, 56, 58, and 60 may be provided depending on the complexibility of the plant. Low pressure storage unit 60 feeds a compressor, 62, which takes low pressure cryogenic vapor through conduit 89 and compresses and delivers a high pressure cryogenic gas in conduit 91 to high pressure storage unit 58.

Conduit 64, check valve 66 and block valve 68, as well as control valve 70, pressure measuring device 72 and pressure control device 74 allow optional introduction of a dry gas into environmental testing chamber 52. This is desired for example to reduce the possibility of moisture condensing within the test chamber and on the component being tested. Further, if components 16 enter testing chamber 52 in "wet" condition, as when stored in humid conditions, it may be desired to find out how long it might take to reduce the moisture content on the surface of component 16. Introduction of the optional dry gas may also serve to remove any frozen or liquid condensate on coils 78 and 80.

The optional dry gas, plus any cryogenic fluid that might leak out of coils 78 and 80, is allowed to leave the system through an optional vent conduit 76.

Cryogenic fluid source 54 feeds a conduit 82 and flow regulator 84 with cryogenic fluid. Conduit 82 typically splits into one or more conduits, illustrated in FIG. 2 as 81 and 83, which feed coils 80 and 78, respectively. Coils 80 and 78 are "smartly positioned" in environmental stress screening chamber 52 so as to provide optimal cooling of component 16. For example, as illustrated in embodiment 50 in FIG. 2, coils 78 and 80 may be positioned directly below and above component 16. A block valve 85 preferably allows gas to bypass chamber 52, if open. This may be preferred for example, if more inert gas is desired in other areas of the plant.

After being compressed by compressor 62, if desired, a pressure regulator 90 may allow high pressure cryogenic gas to flow out of high pressure storage unit 58, through conduit 93, back pressure regulator 90, and check valve 92 into conduit 96. Conduit 96 then routes high-pressure cryogenic gas to other end users within the same or other plants. Other such uses for high-pressure cryogenic gas in conduit 96 may be for example to use for a pressure source in cryogenic fluid storage vessel 54, if necessary. Another use of high-pressure cryogenic gas flowing in conduit 96 may be for gas blanketing purposes, for example in wave or reflow soldering applications, or to blanket tanks in situations where there might be potentially explosive gaseous mixtures in the vapor space of chemical storage tanks.

Conduit 96 is also preferably fed by vaporized cryogenic fluid from cryogenic fluid storage container 54. This would be achieved by opening block file 98 in conduit 100, allowing a liquefied cryogenic fluid to flow through conduit 100 into a heat exchanger or vaporizer 56. The vaporized gas exists through conduit 104, backpressure regulator 106, and check valve 108 into conduit 96. Preferably, a fluid flowing in conduit 102 provides heat to vaporize the cryogenic fluid, such as air or low-pressure steam. Alternatively, external heating pads or electrical heat tracing coils could be used.

As explained herein, two key aspects of the invention are the smart positioning of coils 78 and 80 within chamber 52 to provide maximum cooling potential and reduce the amount of cryogenic fluid necessary to perform a given test, and also the wise utilization of a vaporized cryogenic fluid, either recycling via a thermosiphon, or use in other parts of the plant, or offsite through the provision of "recycling" equipment 60, 62, 58, and 96 as illustrated in FIG. 2. Pressure indicators P1, P2, and P3, as indicated at 94, 110 and 72, respectively, in FIG. 2 monitor the embodiment 50. P2 is preferably set at a pressure lower than P1. These two pressures are adjusted by adjusting the settings of backpressure regulators 90 and 106.

Another preferred feature in the embodiment of FIG. 2 is the provision of level measuring device 112. A controller 114 receives signals from level sensor 112 and a temperature sensor 124 positioned on chamber 52. Controller 114 might be controlled by supervisory control system (not illustrated). Controller 114 preferably controls control valves 84 and 116. Control valve 84 allows cryogenic fluid to flow through conduit 82 as previously described. Optionally, control valve 116 allows fresh cryogenic fluid to refill cryogenic fluid container 54, through conduit 118. Pressure relief devices 120 and 122 are preferably provided on environmental stress screening chamber 52 and cryogenic fluid source 54, respectively. Pressure relief devices are set to relieve if the pressures within chambers 52 and 54 increase beyond certain design pressure specifications.

Figure 3:
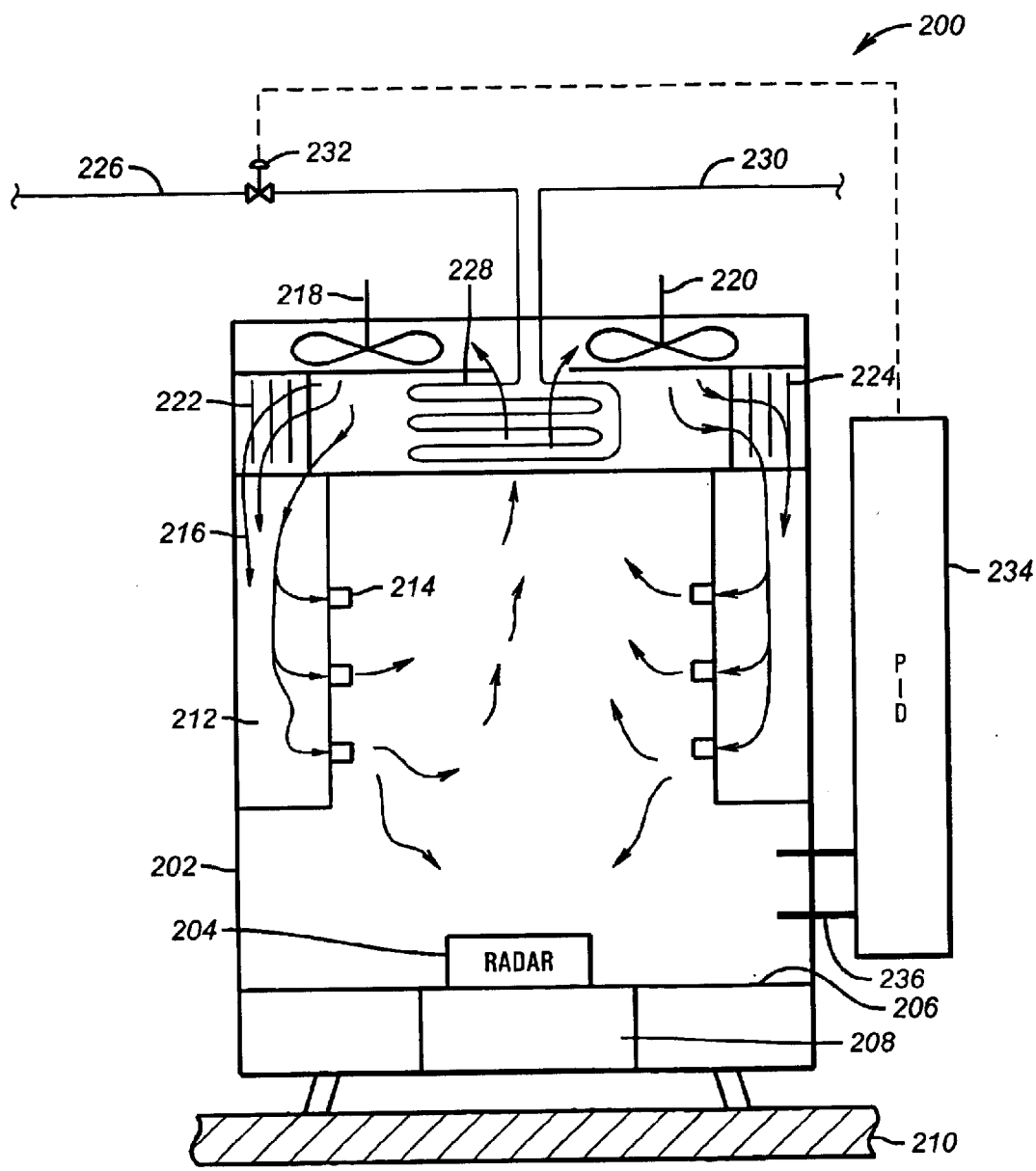

Another preferred embodiment 200 of the invention is illustrated in FIG. 3. Embodiment 200 includes a test cabinet 202 in which is placed a component to be tested 204, indicated here as a radar sub-system. Sub-system 204 rests on a shelf 206, which in turn rests or is connected to a support 208 through which devices such as sub-system 204 are preferably electrically connected to a power source (not shown). In this way, devices 204 are preferably powered up and operated in simulated environments. Test cabinet 202 rests on a plant floor 210 or other support surface. Embodiment 200 includes a gas plenum 212 through which vaporized cryogen flows, as indicated by the various arrows 216. The gas flows through plenum 212 and then through nozzles 214 (six depicted in FIG. 3, although this number may vary). Nozzles 214 direct gas toward and around sub-system 204 to achieve temperature change of the test component. Fans 218 and 220 in this embodiment are disposed near the top of cabinet 202, and help circulate vaporized cryogen, or warm gas via heating units 222 and 224. Cryogenic liquid enters through a conduit 226, passes through a coil 228, and exits through another conduit 230. Cryogenic liquid flow is controlled via a control valve 232, which in turn is actuated by a controller, preferably a PID controller 234. Controller 234 accepts one or more temperature measurements from units 236 as illustrated in FIG. 3.

In the preferred embodiment 200 illustrated in FIG. 3, alternative embodiments might include multiple coils 228, with associated inlet and outlet conduits and control valves. More than two fans may be present, and their position within cabinet 202 varied, for example one fan on the top and one fan on the bottom, or one on each of the sides of the cabinet.

Although the above description of preferred methods and apparatus of the invention are representative of the invention, they are by no means intended to limit the appended claims.

What is claimed is:

1. A method of environmental testing of a component, the method comprising the steps of:
   (a) placing a component to be tested into a chamber, the chamber having an internal space filled with a gaseous atmosphere;
   (b) convectively cooling the component by smartly positioning one or more cooling coils near the component to be tested so as to control the temperature of the component from 1° C. $\Delta T$ per minute to 100° C. $\Delta T$ per minute;
   (c) feeding the cooling coils with a cryogenic fluid from a source of cryogenic fluid, thus cooling the component and creating a warmer cryogenic fluid; and
   (d) recycling the warmer cryogenic fluid to the source of cryogenic fluid in a thermosiphon fashion using a thermosiphon conduit loop.

2. The method of claim 1 wherein the gaseous atmosphere is non-stagnant within said internal space.

3. The method of claim 1 including measuring a temperature of the gaseous atmosphere in the internal space.

4. The method of claim 3 including controlling flow of said cryogenic fluid at least partially based on said temperature.

5. The method of claim 1 including measuring a temperature of the cryogenic fluid flowing into said coils.

6. The method of claim 5 including controlling flow of cryogenic fluid at least partially based on said temperature.

7. The method of claim 1 wherein the gaseous atmosphere is dry by virtue of feeding a dry gas into the internal space.

8. An apparatus for environmental testing of one or more components, the apparatus comprising:
   (a) a test chamber having an internal space adapted to hold one or more components to be tested;
   (b) at least one cooling coil smartly positioned within said test chamber that can convectively control the temperature of the component from 1° C. $\Delta T$ per minute to 100° C. $\Delta T$ per minute;
   (c) a cryogenic fluid feed conduit connecting a source of cryogenic fluid and an inlet to said at least one cooling coil; and
   (d) a cryogenic fluid return conduit connecting an outlet of said at least one cooling coil to said source of cryogenic fluid, wherein said cryogenic fluid feed conduit and said cryogenic fluid return conduit are connected in a thermosiphon loop.

9. The apparatus of claim 8 wherein said test chamber includes means for moving the gaseous atmosphere in the internal space.

10. The apparatus of claim 8 including means for measuring temperature of the internal space of said test chamber.

11. The apparatus of claim 8 including means to control flow of said cryogenic fluid from said cryogenic fluid source.

12. A method of environmental testing of a component, the method comprising the steps of:
    (a) placing a component to be tested into a chamber, the chamber having an internal space filled with a gaseous atmosphere;
    (b) convectively cooling the component by smartly positioning one or more cooling coils near the component to be tested so as to control the temperature of the component from 1° C. $\Delta T$ per minute to 100° C. $\Delta T$ per minute;
    (c) feeding the cooling coils with a cryogenic fluid from a source of said cryogenic fluid, thus cooling the component and creating a warmer cryogenic fluid; and
    (d) flowing the warmer cryogenic fluid to a low-pressure storage device.

13. The method of claim 12 including compressing the cryogenic fluid and routing at least some of the compressed cryogenic fluid to another use point, said use point selected from the group consisting of other uses on-site, other uses off-site, and storage containers.

14. The method of claim 12 including routing a portion of said warmer cryogenic fluid into said internal space.

15. The method of claim 12 including routing a dry gas into said internal space.

16. The method of claim 12 including vaporizing a portion of the cryogenic fluid in said cryogenic fluid storage container and routing it to other uses.

17. An apparatus for environmental testing of one or more components, the apparatus comprising:
    (a) a test chamber having an internal space adapted to hold one or more components to be tested;
    (b) at least one cooling coil smartly positioned within said test chamber that can convectively control the temperature of the component from 1° C. $\Delta T$ per minute to 100° C. $\Delta T$ per minute;
    (c) a cryogenic fluid feed conduit connecting a source of cryogenic fluid and an inlet to said at least one cooling coil; and
    (d) a low-pressure storage device for receiving said warmer cryogenic fluid, and a conduit connecting an outlet of said at least one cooling coil to said low-pressure storage device.

18. The apparatus of claim 17 comprising compression means and a high-pressure storage device which takes feed from the compression means.

19. The apparatus of claim 18 including a conduit that feeds said compressed cryogenic fluid to other points of use.

20. The apparatus of claim 17 including means for allowing a portion of the warmer cryogenic fluid to enter the internal space in said test chamber.

21. The apparatus of claim 17 including means for delivery of a dry gas to said internal space.

* * * * *